United States Patent [19]

Christensen

[11] Patent Number: 4,498,952

[45] Date of Patent: Feb. 12, 1985

[54] BATCH FABRICATION PROCEDURE FOR MANUFACTURE OF ARRAYS OF FIELD EMITTED ELECTRON BEAMS WITH INTEGRAL SELF-ALIGNED OPTICAL LENSE IN MICROGUNS

[75] Inventor: Alton O. Christensen, Milpitas, Calif.

[73] Assignee: Condesin, Inc., Fremont, Calif.

[21] Appl. No.: 419,499

[22] Filed: Sep. 17, 1982

[51] Int. Cl.[3] ...................... B44C 1/22; H01L 21/306; C23F 1/02; B05D 5/12

[52] U.S. Cl. ................................. 156/643; 29/569 L; 29/580; 156/644; 156/646; 156/652; 156/655; 313/309; 313/311; 357/30; 357/55; 427/77; 250/396 R; 445/51; 445/58

[58] Field of Search ........ 156/643, 644, 646, 650–653, 156/655, 656, 657, 659.1, 663, 667; 250/396 R, 397, 399; 29/569 R, 569 L, 572, 580, 25.11, 25.14, 25.17, 25.18; 204/192 CE, 192 E; 427/77, 190–192, 195, 198, 259, 307; 313/306–311, 346 R; 357/16, 17, 19, 29, 30, 55

[56] References Cited

U.S. PATENT DOCUMENTS

| | | | |
|---|---|---|---|
| 3,998,678 | 12/1976 | Fukase et al. | 156/651 |
| 4,291,068 | 9/1981 | Jones et al. | 156/662 X |

*Primary Examiner*—William A. Powell
*Attorney, Agent, or Firm*—Gunn, Lee & Jackson

[57] ABSTRACT

A semiconductor type batch fabrication procedure is disclosed in the preferred and illustrated embodiment. The process forms individual field emission devices and the necessary electron optics for each. The optics, having the form of various anodes, is aligned on a common axis above a pyramid or conic member terminating at a tip which functions as a microgun with the anodes. The microgun structure is supported on a substrate and forms, modulates, deflects and focuses electron beams. The complete device utilizes voltage levels routinely obtained in conventional integrated circuits, which integrated circuits may be simultaneously fabricated on the same supportive substrate with the microguns. The procedure further contemplates the fabrication of a complete array of microguns arranged in rows and columns.

13 Claims, 18 Drawing Figures

FIG. 1
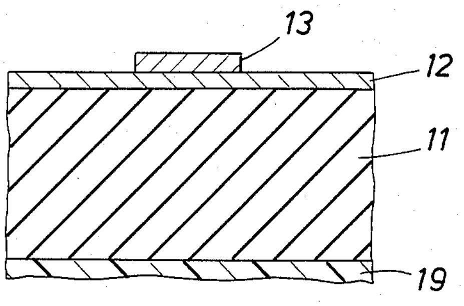
FIG. 5
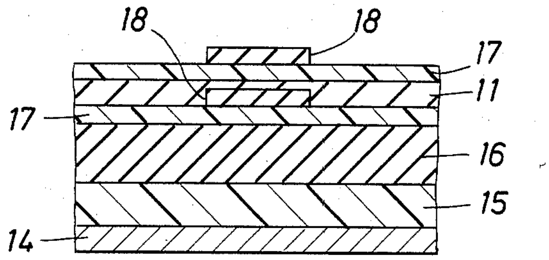
FIG. 2
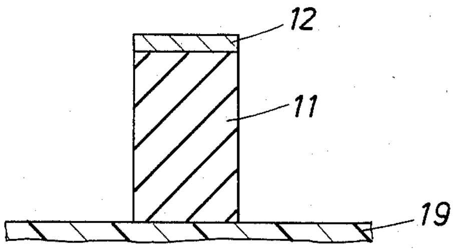
FIG. 6
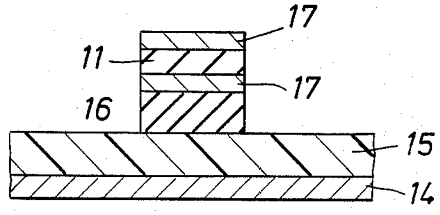
FIG. 3
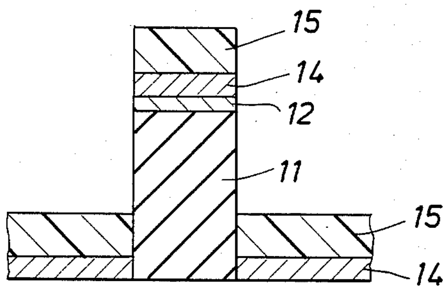
FIG. 7
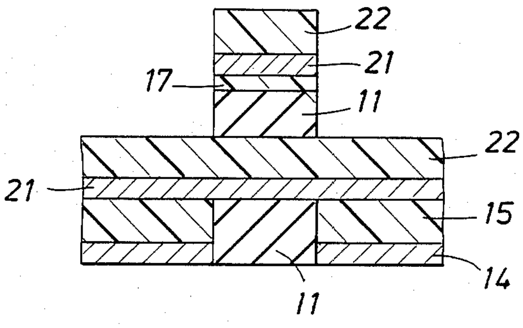
FIG. 4
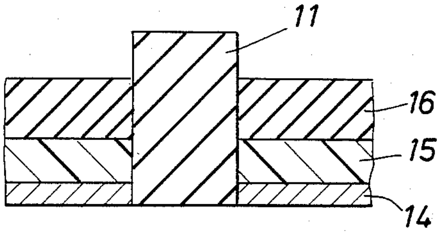
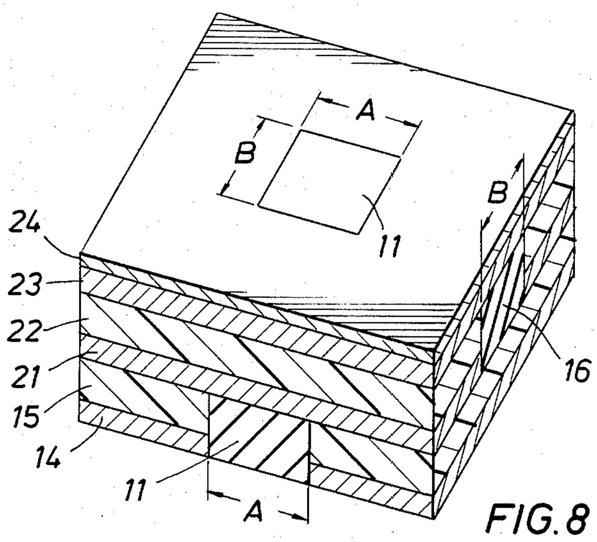
FIG. 8

FIG. 9
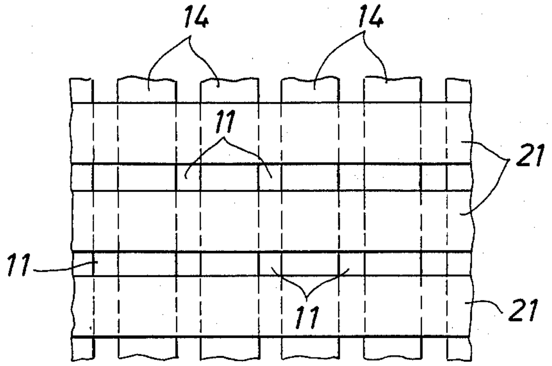
FIG. 12
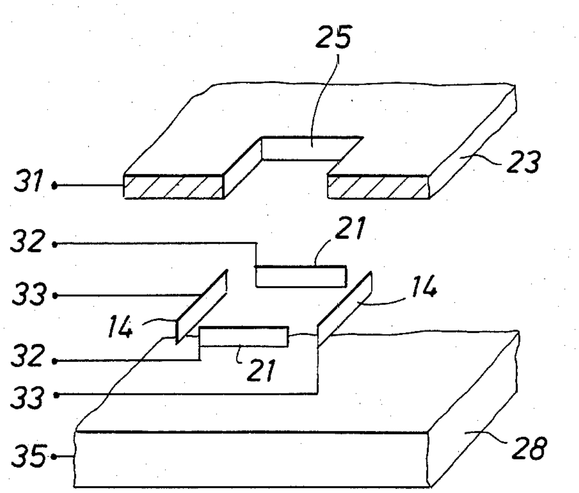
FIG. 10
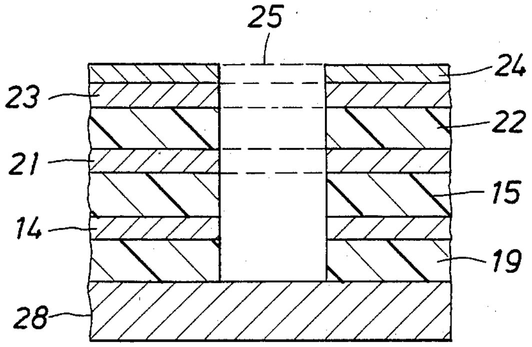
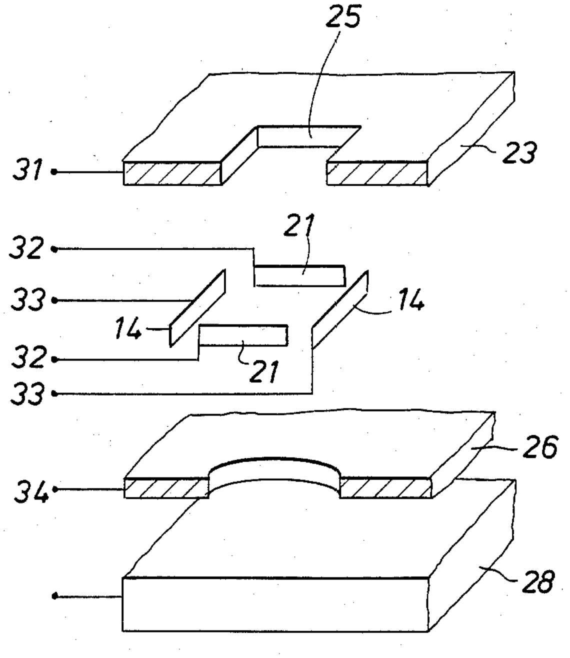
FIG. 11
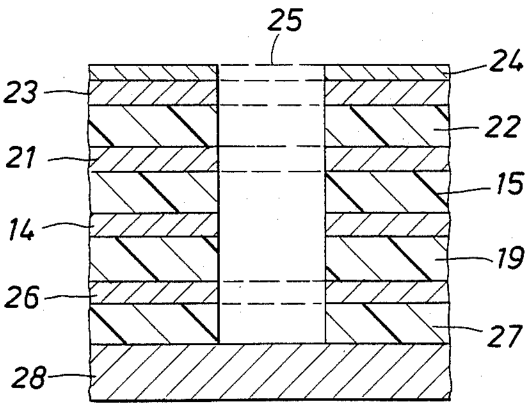
FIG. 13

FIG.14
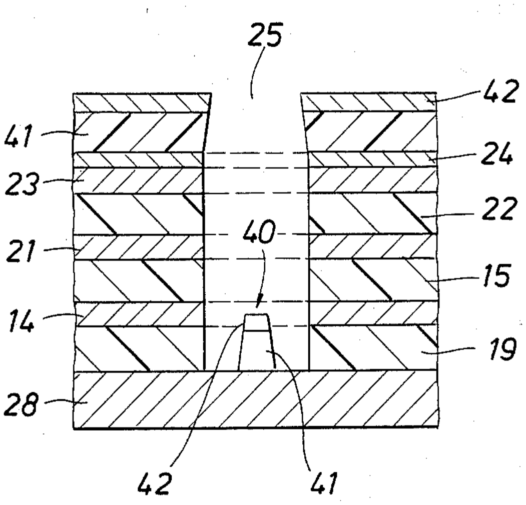
FIG.16
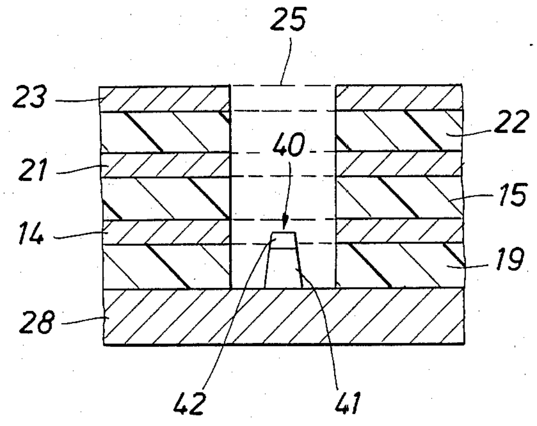
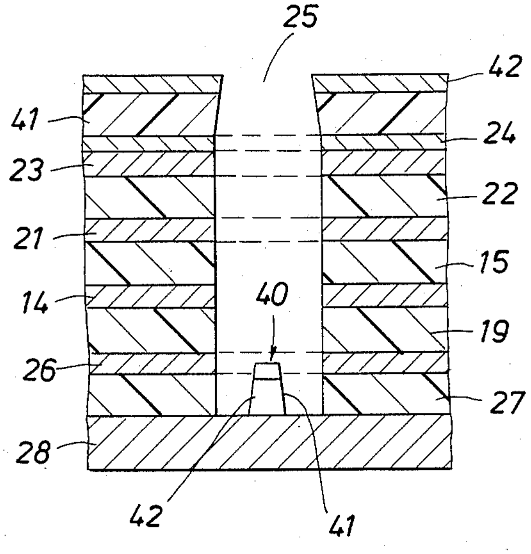
FIG.15
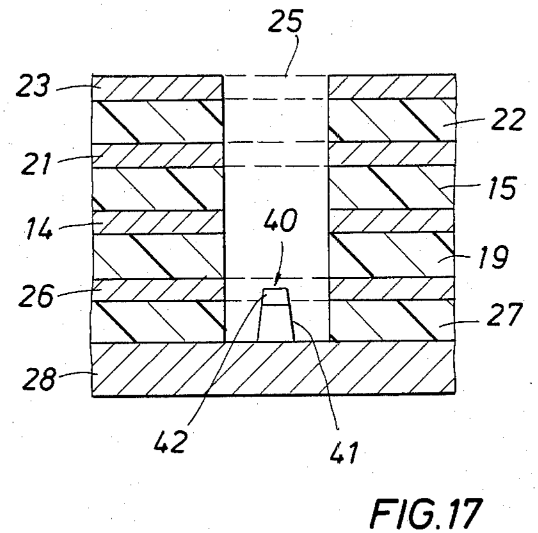
FIG.17
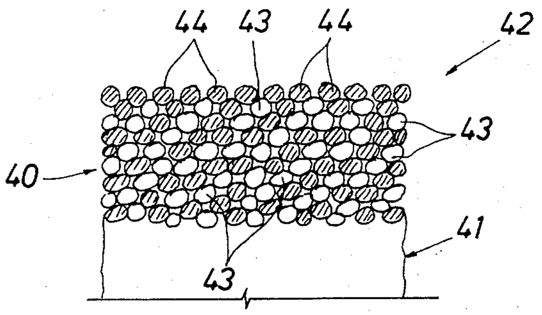
FIG.18

BATCH FABRICATION PROCEDURE FOR MANUFACTURE OF ARRAYS OF FIELD EMITTED ELECTRON BEAMS WITH INTEGRAL SELF-ALIGNED OPTICAL LENSE IN MICROGUNS

RELATED APPLICATIONS

A companion application to this is application Ser. No. 419,501 filed on the same filing date.

BACKGROUND OF THE DISCLOSURE

The companion application is directed to an apparatus described as a microgun. This disclosure reveals a method of manufacturing the microgun. In particular, it describes a supportive substrate, a pyramid field emission device, suitable anodes cooperative with it to define an electron optical system for formation of a beam. The various anodes are manufactured in selected layers by semi-conductor type batch manufacturing process which may simultaneously fabricate on the same supportive substrate the necessary integrated circuits to control the electron optical elements. This method further relates to a procedure whereby a cermet material is selectively shaped and placed on a supportive substrate to define an electron emitting member, and in conjunction with subsequently formed anodes, thereby yields a microgun assembly.

Methods of fabricating field emission devices have been described in the following references:

(A) Spindt U.S. Pat. No. 3,755,704

(B) Spindt U.S. Pat. No. 3,789,471

(C) Spindt U.S. Pat. No. 3,812,599

(D) Spindt *Journal of Applied Physics*, Vol. 47, No. 12, 1976

(E) Fraser U.S. Pat. No. 3,753,022

(F) Redman U.S. Pat. No. 3,982,147

(G) Levine U.S. Pat. No. 3,921,022

(H) Oess U.S. Pat. No. 3,935,500

(I) Fukase U.S. Pat. No. 3,998,678

Regarding these prior art devices, they all appear to employ metallic emitters with one or more electron optical elements. The several references of Spindt disclose and describe a device having relatively large size, typically in the range of about 0.1 millimeter square dimensions. Moreover, this is accomplished without optical elements for deflection and focus. Fraser follows Spindt and adds electron optical elements, which elements must be mechanically aligned and therefore which suffer from inaccuracies of alignment. Mechanical alignment inaccuracies are probably the major cause of fabrication failure in semiconductor processes, thereby yielding the most severe form of distortion. Accordingly, Fraser is therefore severely limited in the manufacture of an economical field emission device. Redman requires similar mechanical alignment and limits the number of emitters which can be fabricated in an array because of the same problems of Fraser. Levine requires mechanical alignment of successive layers, thereby compounding the probability of misalignment in the fabrication of the finished product. Oess is probably the most susceptible to mechanical problems in fabrication and has the highest probability of misalignment. The various prior art devices produce emitting services which have large and relatively limited random emitting sites on the surface. This inevitably creates substantial noise. In like fashion, all the prior art references are limited in the ability to fabricate an unlimited number of microgun structures over an unlimited area to take advantage of the economies obtained in the batch fabrication procedure disclosed herein.

SUMMARY OF THE PRESENT DISCLOSURE

This disclosure is a procedure for fabrication of a microgun which has a shaped field emitter, two axis deflection system, anodes for focus and beam definition. The method includes batch fabrication techniques from semiconductor integrated circuit manufacture including deposition, masking, reactive sputter etching to define precise components, thereby avoiding mechanical misalignment problems and thereby forming a field emitter and associated electron optical elements arranged at an aperture on a common axis. A precise relationship between the elements is achieved without requiring mechanical alignment steps. It is self-aligned. Self-alignment of the electron optical elements used in modulation, deflection and focus has not been obtained heretofore in the prior art, and has especially not been obtained in multiple identical structures deployed with a large silicon wafer. This method thus defines a field emitter which is duplicated in rows and columns in a selective pattern. The field emitter is comprised of upwards of about 10,000 emitting insulative particles on the surface of a cermet of conductive and insulative particles comingled in the field emitting device, yielding a current emission device having improved performance characteristics over prior art devices. The control voltages are significantly small, typically in the range of 5 volts or less, these being voltages easily controlled by integrated circuits mounted on and located at a side board location.

DESCRIPTION OF THE DRAWINGS

So that the manner in which the above-recited features, advantages and objects of the invention, as well as others, which will become apparent, are attained and understood in detail, a more particular description of the method in its several discreet steps is illustrated in the appended drawings, which drawings form a part of this specification. It is noted, however, that the appended drawings illustrate only typical embodiments of the invention and are not to be considered limiting of its scope, for the invention may admit to other equally effective embodiments.

FIG. 1 is a cross-sectional view of a substrate during an early stage of the method of manufacture;

FIG. 2 is a cross-sectional view at a second stage of the method;

FIG. 3 is a cross-sectional view at a third stage of the method;

FIG. 4 is a cross-sectional view at a fourth stage of the method;

FIG. 5 is a cross-sectional view, rotated 90 degrees from FIG. 4, at a fifth stage of the method;

FIG. 6 is a cross-sectional view at a sixth stage of the method;

FIG. 7 is a cross-sectional view at a seventh stage of the method;

FIG. 8 is a perspective view of an eighth stage of the method;

FIG. 9 is a planar view of the orthogonal deflection element pairs constructed by the present method;

FIG. 10 is a cross-sectional view of the apertured microgun structure;

FIG. 11 is a cross-sectional view of an alternate apertured microgun structure;

FIG. 12 is a schematic diagram of the connections to the microgun elements;

FIG. 13 is a schematic diagram of the connections to the alternate microgun elements;

FIG. 14 is a cross-sectional view of the eighth stage of the method;

FIG. 15 is a cross-sectional view of an alternate structure at the eighth stage of the method;

FIG. 16 is a cross-sectional view of a completed microgun structure;

FIG. 17 is a cross-sectional view of an alternate complete microgun structure; and FIG. 18 is a cross-sectional view of the surface of the microgun emitter.

DETAILED DESCRIPTION OF THE METHOD OF MANUFACTURE OF MICROGUNS

Microguns are fabricated across the expanse of an entire semiconductor wafer utilizing the steps taught by this disclosure. The steps employ batch fabrication techniques including steps such as deposition, masking and reactive sputter etching. Reactive sputter etching is used to obtain large relative etch rates of the material to be etched in comparison with the material used to mask the areas preliminary to etching. References are made to the literature for data and procedures for use with reactive sputter etching utilizing gases and mixtures of gases in a plasma discharge to volatilize the material to be etched as an effluent of the process. As an example, one such gas is carbon tetrafloride ($CF_4$). This gas may be mixed or combined with oxygen, nitrogen and hydrogen as required by a particular material to be etched and may also be relatively pure. One such source of sputter etching is Applied Materials, Inc., Santa Clara, Calif.

Going to FIG. 1 of the drawings, which shows a beginning step, a layer 11 of polymer is deposited on the surface of the silica layer 19. The silica 19 is the stock required for beginning this procedure, and is shown in FIG. 1. It also is observed in FIGS. 10 and 11. The intervening figures show steps fabricated utilizing the silica layer or wafer as a supportive base. This first step for the subsequent steps utilizes principles taught in Wang, *Solid State Technology,* August, 1980. The polymer 11 is a resist such as PMMA. The layer 11 is applied by spinning on in the usual resist application procedure to a thickness equal to the sum of thicknesses of subsequently deposited layers, being about 1.7 to about 2.2 microns. The exact thickness of the layers of the microgun structure is determined by the electro-optical characteristics required for use with a particular target for the electron beam. The next step involves depositing the polysilicon layer 12 to a thickness of about 0.15 microns. The polysilicon layer 12 is a mask to reactive sputter etching of the polymer 11. The polysilicon layer 12 is delineated by the layer 13 in a standard resist deposition and mask exposure of the resist layer 13. The resist strip 13 is delineated to a width of about 1 to about 1.3 microns. It has a length of the number of microguns (N) times the center to center spacing of the microguns. For instance, if there are to be 64 microguns, the strip 13 has a length of 64 times the center to center spacing of a pair of microguns. The strip length has an added part for alignment, typically about 5 microns maximum. The resist strip 13 is sufficiently thick to mask the polysilicon layer 12 for the next step, the reactive sputter etch. This thickness is typically about 0.18 microns, and of course, any remaining resist 13 after etching is removed.

FIGS. 1 and 2 show the contrast which occurs after reactive sputter etching of the polymer 11 selectively by the silica layer 12. The polymer 11, after etching, is a ridge having a height of about 1.7 to about 2.2 microns, a width in the range of 1 to 1.3 microns, and a length equal to N times spacing plus alignment error as described above. The total length is restricted by the surface dimension of the supportive silica substrate 19. Moreover, only a single ridge has been described; there can be any number M of ridges parallel to the described ridge, all simultaneously fabricated, where M times N microguns will be fabricated on a silica layer 19.

A representative reactive sputter etching rate of the polymer 11 to the polysilicon 12 is about 30:1. This will typically leave about 0.1 micron thickness of polysilicon 12 after completion of the step of etching the polymer 11.

Going now to FIG. 3, additional layers are shown deposited on the blank. The term blank refers to the silica layer 19 at any stage of processing short of completion. Thus, many of the views in the drawings disclose the blank, at least a limited portion of it. In FIG. 3, the blank has received two additional layers, the first being a conductor layer 14 and an insulative layer 15. The layer 14 is made of conductive material, while the layer 15 is an insulative material such as silica. The silica layer 19 supports the structure in FIG. 3; the layer 19 has been omitted to show the upper layers. The layers 14 and 15 are directionally normal at deposition. As a result of the ridge 11, the resulting deposition of layers 14 and 15 places them aligned against the sides of the ridge 11. There is a discontinuity in the layers 14 and 15 above the polysilicon layer 12. For materials, the layer 14 can be selected from the group of conductors such as aluminum, molybdenum, doped polysilicon, or refractory metal silicides. The conductor 14 also collaterally serves as the first layer interconnection material for integrated circuitry to the side. This is circuitry made simultaneously as sideboard located control circuits. Needless to say, that process fabricates integrated circuits using MOS or bipolar techniques to form devices which need not be detailed at this juncture. The layer 14 is typically in the range of about 0.15 to about 0.6 microns thick. The silica layer 15 placed on top of it is an insulative layer. It typically is about 0.3 to about 0.6 microns thick. After deposition of the silica layer 15, a selective chemical etch occurs to remove the material on top of the polymer 11. In other words, the top of the ridge is cleared to remove the layers 12, 14 and 15 above the ridge.

Referring now to FIG. 4, a second layer of polymer 16 is spun onto the surface of the silica layer 15 utilizing the same procedure as was used to apply the layer 11. The polymer 16 is applied to a thickness such that its upper surface lies about 0.4 microns below the top of the ridge. FIG. 4 and FIG. 5 should be contrasted; they show the same structure rotated at 90°. In FIG. 5, the ridge 11 runs fully across the view while FIG. 4 shows the end of the ridge. Moreover, FIG. 5 shows the addition of the next layer which is a layer 17 of polysilicon deposited over the surface followed by a subsequent layer of resist material 18. The resist material 18 is delineated into parallel strips approximately 1 to about 1.3 microns in width. The strips have a length dependent on spacing and can readily extend from edge to edge of the blank. Typically again, an alignment error of about 5 microns is tolerated. So that it will be understood, the resist 18 is applied in a strip perpendicular to the ridge 11. The resist strip 18 thus is used in a similar fashion to the ridge 11. There are parallel strips 18 across the blank.

The layers 17 and 18 are handled in the same fashion as the layers 12 and 13. The layer 17 is thus delineated and serves as a reactive sputter etch mask for removal of the polymer 16.

Viewing FIG. 5, it will be observed that the resist 18 is shown in islands. They are not actually islands; they are strips at two elevations, one selectively raised in islands where strips pass over the ridge 11. The transition from the arrangement of FIG. 5 to FIG. 6 shows how the ridge 11 has been etched. It was an elongate, uninterrupted ridge in FIG. 4. It is etched and removed in the same fashion to define aligned N islands. If, for instance, the ridge 11 has sufficient length to accommodate 64 microguns, it is formed into 64 duplicate islands in FIG. 6. As a consequence, FIG. 6 shows, in cross-section, a single island having dimensions determined by the width of the ridge 11 and the width of the resist 18 applied on it as shown in FIG. 5. Only the material under the resist 18 remains; at this juncture, the blank then has a number of islands on it in a rectangular pattern, the number being given by M×N. Moreover, the island of polymer material 11 retains the deposited layers 17 and 18 on the top. The layer 18 remains until it is etched away. It is for this reason that FIG. 6 shows a portion of the layer 17 remaining at two elevations. The layer 17 is thus observed at two elevations in FIG. 5 and it remains at two elevations in FIG. 6 when viewed from the same point of perspective as FIG. 5.

For this reason, FIG. 6 shows, in cross-sectional view, a ridge with islands having two heights. So to speak, it is serrated.

Attention is next directed to FIG. 7. FIG. 7 is rotated at 90° from the arrangement of FIG. 6. It will be recalled that FIGS. 5 and 6 are the same side. FIG. 7 is the same side as FIG. 4. FIGS. 5 and 6 are at right angles to FIGS. 4 and 7. In FIG. 7, the polymer ridge 16 spans the width of the view but the polymer ridge 16 is obscured by the added layer to be deposited.

Beginning with the blank held in the position of FIG. 7, additional layers are applied. They are normally deposited. This includes a second conductor 21 and a silica insulative layer 22. The silica layer 22 is deposited to a thickness such that it is coincident with the top edge of the polymer ridge 16. The polymer ridge 16 functions as an alignment mask to provide separation of layers 21 and 22. A top view would show the layer 22 in strips which are isolated from one another, this to be discussed regarding FIG. 9. The layers 21 and 22 are also deposited onto the polysilicon square 17 which is raised above the blank on the polymer pillar 11. The pillar 11 has a height increased by the addition of layers 17, 21 and 22.

Reviewing, at this juncture, the original ridge 11 began as a rectangular ridge. This is shown in FIG. 2 as an example. By the selective application of the resist 18 shown in FIG. 4, certain portions of it were protected while other portions were not. It has, therefore, been interrupted at every location between sites for the microguns. The ridges which were formed with the polymer 16 were also formed as ridges at right angles to the ridges 11. They were not constructed as tall, and are shown interrupted in FIG. 4; they extend fully across the unfinished blank subject to these interruptions. The ridges 16 were protected at spaced locations by the resist 18 placed on top in grid or strip patterns. Thereafter, the ridges 16 were selectively etched or removed. This leaves the ridges 16 also interrupted. The ridges 16 are selectively protected as shown in FIG. 5 against subsequent removal. This removal proceeds, leaving a portion of the ridges 16 at full height and a portion which has been etched. The ridge 16 thus spans the width of FIG. 7 and is similar to FIG. 4 in this regard. However, the ridge 16 has been removed partially.

After deposition of the conductor layer 21 and the silica insulative layer 22, the deposition depth restores the height of the blank above the polymer 16 to the original height of the polymer 16, the polymer 16 then serving as an alignment mask for separation of layers 21 and 22. The layers 21 and 22 are also deposited on the polysilicon rectangle 17 on the top of the polymer pillar 11. As shown in FIG. 7, the pillar 11 thus supports layers 17, 21 and 22. Moreover, this is the only portion of the layer 17 which now remains on the blank. The layer 17 was applied earlier and, most portions of it have previously been removed save and except that portion on the pillar 11.

Two additional layers are then applied. The lower layer being a titanium layer 23 and the upper layer being a parting layer 24. These are applied after removal of the island layers shown at the top of FIG. 7 above the layer 17. The layer 17 is removed by chemically dissolving the layer. This inevitably removes the layers 21 and 22 in island segments. Accordingly, application of the layers 23 and 24 and the removal of the polysilicon layer 17 finishes the blank to a generally planar top surface as shown in FIG. 8. The structure of FIG. 8 is thus accomplished by the step of chemically dissolving the layer 17 after controllably depositing the thickness of the layers 23 and 24 to that level.

FIG. 8 further shows the remnants of the original ridges 11 and 16. The rectangular pillar 11 remains; a lower portion of the original ridge 11 is also shown at one face of the sectional cut comprising FIG. 8 while the transverse ridge 16 is also shown at the other face.

Reviewing FIG. 8, it will be observed that the polymers 11 and 16 which were originally formed into perpendicular ridges also separate the first conductor layer into aligned conductor pairs. The layer 14 is divided left and right; this defines an aligned conductor pair, and they occur on opposite sides of the remnants of the ridge 11. The second conductor 21 is also aligned in conductor pairs at right angles to the pair from the layer 14. The layers 23 and 24 surround the pillar in FIG. 8 and are not divided into separate strips or conductor pairs. The layer 23, and the cooperative parting layer 24 are configured into suitable connections at sideboard locations on the blank to enable access of the sideboard mounted control ICs, or to otherwise configure bonding pads. Moreover, the layers can be also delineated as interconnections in the semiconductor masking steps to thereby fabricate IC interconnections.

The topmost conductive layer is the layer 23 subject to an exposure step which will be described. This topmost material is preferably titanium because it acts as a getter for hydrogen which leaks into the operative space. Moreover, the layer 23 is a conductor which shields the two axis deflector bars 14 and 21 beneath it. This electrostatically isolates the deflector pairs to enable proper deflection without influence from larger voltages from the exterior including the accelerating potential applied between the microgun and a target.

The effect of the shield formed by the layer 23 also limits the field amplitude requirements for the layers 14 and 21 when used as deflection bars. This enhances the sensitivity of the microgun.

FIG. 9 is a plan view of the layers 14 and 21, ignoring intervening layers. The layers 14 and 21 are depicted in orthogonal relationship as comprising adjacent pairs of conductors. A two axis deflection system is thus defined for each microgun. The location for each pillar of polymer material remaining (see FIG. 8) at enclosed right angle intersections of the deflection pairs 14 and 21 thus locates the microguns for response to deflection. Moreover, the deflection bars can be used with adjacent microguns, i.e. one bar serves a microgun on one side and another microgun on the opposite side.

The next step utilizes the parting layer 24. Preferably, it has a relatively low etch rate in reactive sputter etching compared with the polymer 11, silica insulative materials, and the materials used for the interconnective conductors. The parting layer preferably has a relatively high selective chemical etch rate compared with titanium. It is also relatively high compared to the microgun emitter. Moreover, the parting material cannot be a component material used in the fabrication of the cermet emitter, these steps to be described below. Typical materials for the parting layer include but are not limited to alumina, silicon nitride, or vanadia. The parting layer 24 typically has a thickness of about 1/30th of the height of the pillar formed of the polymer 11 plus the thickness of the layer 19 beneath the polymer 11 and any additional layer to be exposed to the next step of chemical etching.

Attention is next directed to FIG. 10 of the drawings. FIG. 10 is a cross-sectional view through the location of the pillar 11. FIG. 10 discloses the layer 14 in cross-section. It will be appreciated that the two portions on opposite sides of the cavity where the pillar was previously located are not necessarily electrically connected. Ideally, they are formed into the deflector strips. The layer 21 is also shaped into isolated strips. The isolation is achieved as discussed above. Accordingly, FIG. 10 shows two steps. First of all, a conductive layer 28 is deposited on the bottom of the blank adjacent to the silica layer 19. Ideally, the layer 28 is a highly conductive N+ diffused layer of semiconductor materials. Moreover, the layer 28 as well as the insulative silica layer 19 are used in sideboard located integrated circuit construction procedures. FIG. 10 shows a second step, namely the reactive sputter etching removal of the column 11. The removal completely clears a rectangular cavity as shown in FIG. 10. Moreover, it is permitted to continue through the silica layer 19. The silica layer 19 is penetrated until the rectangular opening exposes the conductive layer 28 shown in FIG. 10 at the bottom of a cavity 25. The cavity 25 is located where the pillar 11 once was located.

The addition of layers at the bottom of the blank enables additional procedures to be accomplished. For instance, the IC fabrication process is compatible with an N−channel MOS manufacturing process. Alternate procedures include the fabrication of CMOS or bipolar transistors utilizing an N+ surface layer, namely the layer 28 extended. Moreover, the sideboard manufacturing procedures can also use the topmost layer 24. FIG. 11 shows alternate structures which are obtained by adding lower layers. For instance, layers 26 and 27 are added. The layer 26 is a conductor layer and the layer 27 is an insulator. The structure of FIG. 11 assumes a beginning point as a pre-existing bottom layer 19, as was the case in FIG. 8, but three layers are added to the bottom of the blank in contrast with the addition of a single layer shown in FIG. 10. The conductor layer 26 is the first layer interconnect of the integrated circuit fabrication procedure whereupon the layer 14 extended becomes the second layer interconnect. The removal of the pillar also penetrates the layers 26 and 27 to open the cavity to the bottommost layer 28 as shown in FIG. 11.

In use, the layers differ in assignment, but this has little to do with the construction techniques at the cavities which are formed in FIGS. 10 and 11. The aperture which is formed is identified by the numeral 25 in both views. The number of conductive layers adjacent to the aperture determines the flexibility of the finished product. In particular, the specific assignments for the various layers might be altered in the following manner. Using the deflection elements 14 as a first anode, in FIG. 10, the conductor 26 becomes the first anode in FIG. 11. If no deflection is required, the layer 14, in FIG. 10, can be used as the first anode only.

At this juncture, the blank as depicted in FIGS. 10 or 11 includes the aperture 25 through the various layers. The layers support electrodes shown in spacial relationship omitting the insulator layers in FIGS. 12 and 13. Both drawings disclose sideboard terminals 31–35. The first anode is omitted from FIG. 12 while it is included in FIG. 13 at layer 26 with the terminal 34. The first anode can be obtained by imposing the first anode voltage on the lowermost deflection plates 14 in FIG. 12.

Attention is next directed to FIGS. 14 and 15. These views show the structure carried forward from FIGS. 10 and 11. This involves the next step of manufacture, namely, the deposition through the aperture 25 onto the exposed top surface of the supportive substrate 28 of material which forms the emitter of the microgun. In contrast with devices known heretofore, this deposition was typically made from a source that deposited the emitter material normal to the surface of the silicon wafer or blank. This normally would involve deposition of material in an area of about 0.1 millimeters square. Normal deposition procedures of prior art emitter constructions depended on a prior grazing incident deposition which partly closed the aperture. As the aperture was partly closed, surface accumulation of the emitter material during deposition partially closed the aperture to cause the deposited emitted material to come to a conic point as exemplified in Spindt or Fraser. The method of this procedure utilizes the ionic-molecular nature of a sputter deposition.

This manufacturing step is conducted to focus the ionic molecules onto the surface of the layer 28 in a control manner. Bias voltages are applied to the various terminals to achieve this correct deposition. So to speak, the structural elements which can be conductive as shown in FIGS. 12 and 13 are used as an optical focus system. During the deposition of emitter materials, the potential on the terminal 35 is made most negative, treating the sputtering source material as a relative or reference value. Because of the relatively close spacing between the conductor pairs 14 and 21 and the relative dimensions of the aperture 25, a relatively small potential of less than 10 volts between the supportive substrate 28 and the focus elements focuses the deposition materials entering the aperture into the illustrated shape shown in FIGS. 14 and 15. The conic section is formed on the substrate 28. Relatively fine control can be obtained by using selected waveforms of relatively low voltage levels applied to the elements 14 and 21 during deposition. Through the use of previously fabricated conductive elements shown in FIGS. 12 and 13, the entire blank can be deposited with material to form the emitters in the multiple apertures. In effect, this collimates the emitter material deposition step such that the shaped electrodes are formed. There is no waste of apertures.

The sputter deposition procedure is typically a low temperature procedure to maintain relatively small particle size, typically 3.5 nanometers or less.

The actual deposition procedure requires two phases, the first in which the conductor material is deposited with a minimum of insulator material. The second step involves deposition of the conductive material and insulator material simultaneously. A cermet is formed of randomly arranged particles. To accomplish this, the conductor material is sputtered continuously while the insulative material is sputtered, beginning at a later starting time. There is the probability that certain of the sputtered material will be deposited on the parting material 24 on the surface. This material is cleaned after the sputtering step has been completed by chemically dissolving at least a portion of the parting material. Moreover, the cermet surface is sputter cleaned to remove at least a selected portion of the conductive particles. After that, the parting material 24 is partly dissolved chemically to remove any sputtered materials on the surface of the blank. Surface deposits on FIGS. 14 and 15 are removed after formation of the electrodes inside the apertures 25.

The companion disclosure sets forth certain requirements for the materials used in forming the cermet. As related there, the work function of the insulative particles must be less than that of the conductive particles to obtain ohmic contact between the particles. The deposition interaction between the two materials should be accomplished without phase problems to avoid stratification of the cermet. The conductive particles must also have a higher sputter etching rate than the insulative particles. Suitable materials for the two materials are listed in the companion dislosure. It is further noted that a preferred combination of materials is also set forth.

FIGS. 14 and 15 show the completed structure. In either view, a conic or pyramid shape is formed comprised of a conductive base portion 41 and an upper portion 42 which are thoroughly comingled particles of the cermet. FIGS. 14 and 15 also disclose how the emitter 40 is shaped relative to the conductive layers. Ideally, the emitter 40 extends to the plane of the conductive layer 14 or the layer 26.

FIGS. 14 and 15 also show the results of depositing the two sputtered materials onto the blank, namely the accumulation of the top layers 41 and 42. The layer 41 is excessive conductive material. The layer 42 is the comingled cermet materials accumulated on the blank. When the layer 24 is chemically dissolved, it removes the overlying layers 41 and 42 and leaves the exposed titanium top layer 23. The resulting structures are shown in FIGS. 16 and 17. These views represent the completed product.

FIG. 18 discloses a representative sectional view of the cermet at the top of the emitter 40. It is comprised of the lower portion which is substantially pure conductor material in particulate form. The next portion shows the cermet material comprised of conductive particles 43 and insulative particles 44. It will be recalled that the conductive particles 43 have a higher etch rate, enabling their removal to reduce their relative population to leave substantially all insulative particles near the surface. When finished, the total surface of the cermet 42 is a plurality of ohmic contacted insulative particles, and they number typically around 10,000 insulative particles having an effective radiating diameter of about 3.5 nanometers or less.

This describes the completion of the blank. Sideboard electronic controls made of ICs of any suitable configuration or manufactured in the same steps as described above.

Referring to FIGS. 16 and 17 jointly, the two embodiments accomplish the following functions referring to FIGS. 16 and 17:

TABLE 1

| Function | Element Layer FIG. 16 | Number FIG. 17 |
|---|---|---|
| First Anode | 14* | 26 |
| First-axis deflection | 14* | 14 |
| Second-axis deflection | 21 | 21 |
| Focus and field-shield | 23 | 23 |
| Auxiliary focus function | 21 | 14 and 21 |

*Dual function

While the foregoing is directed to the preferred embodiment, the scope is determined by the claims which follow.

I claim:

1. A method of manufacture for fabrication of an array of microguns assisted by a supportive substrate which method comprises the steps of (a) defining a plurality of microgun locations on a substrate by forming aligned parallel ridges in a pattern of M by N wherein the M by N pattern defines sites of microguns in M columns and N rows and the pattern comprises upstanding ridges through the sites of the microguns;

(b) depositing conductive material aligned with the ridges in the form of deflection bars on opposite sides of the ridges at the microgun sites determined in the M by N pattern and further wherein the microgun sites in rows and columns have the respectively defined deflection bars therefore;

(c) depositing over the deflection bars an insulative layer;

(d) depositing over the insulative layer a conductive layer having an opening at each microgun site which opening is defined by the ridges;

(e) removing the ridge material to leave a cavity within the deflection bars and aligned below the opening in the conductive layer thereabove;

(f) forming a conductive substrate at the bottom of the cavity; and (g) depositing a microgun in the cavity on the conductive substrate for emitting electrons into the cavity for deflection by the deflection bars wherein the electrons are directed through the opening formed in the conductive layer.

2. The method of claim 1 wherein the supportive substrate is removed after forming the cavity at the microgun site, and including the step of depositing a semiconductor layer across the nether face of the substrate area whereupon the step of depositing the microgun places the microgun at the microgun site in the cavity and supported by said semiconductor layer.

3. The method of claim 1 wherein said ridges are formed in a first set and a subsequent set orthogonal to the first set.

4. The method of claim 1 including the step of depositing said microgun by a dual continuous deposition of particles of a conductive material comingled with particles of an insulative material.

5. The method of claim 4 wherein the particles of conductive material deposit starts first and the step of depositing insulative material begins later in time so that the microgun is primarily conductive material at the bottom thereof and is primarily insulative material at the top thereof.

6. The method of claim 4 wherein said dual deposition steps are carried out simultaneously to deposit particles up to about 3.5 nanometers in diameter.

7. The method of claim 4 wherein the dual deposition steps are carried out while applying a focusing voltage to the conductive layer deposited in advance of deposition of the particles.

8. The method of claims 1 or 4 including the step of depositing a top layer formed of a conductive material which covers the top except for those areas at the microgun sites.

9. The method of claims 1 or 4 including the step of depositing first and second sets of deflection bars above the substrate in two separate and insulated planes to provide two separate orthogonal deflection bars, and further wherein said deflection bars are between deposited insulator layers above and below.

10. The method of claim 1 wherein the conductive layers are isolated from one another by the step of depositing insulative layers above and below said conductive layers.

11. The method of claim 1 including the step of self-aligning a deposited microgun formed by particle deposition directing particles for the microgun toward a cavity wherein the shape and depth of the cavity partially controls the deposited particles, and the shape is further assisted by applying selected particle control voltages to conductive or semiconductor materials previously deposited.

12. The method of claim 11 including the step of first placing a sacrifical parting layer on the exposed top surface to enable subsequent removal of any particles deposited on the top surface.

13. The method of claim 1 including the step of altering the height of ridges to define separate deflection bars adjacent to microgun sites.

* * * * *